(12) United States Patent
Chen

(10) Patent No.: US 7,446,548 B2
(45) Date of Patent: Nov. 4, 2008

(54) ELASTIC MICRO PROBE AND METHOD OF MAKING SAME

(75) Inventor: Chih-Chung Chen, Taipei (TW)

(73) Assignee: MJC Probe Incorporation, Hsinchu Hsiang (TW)

( * ) Notice: Subject to any disclaimer, the term of this patent is extended or adjusted under 35 U.S.C. 154(b) by 201 days.

(21) Appl. No.: 11/328,315

(22) Filed: Jan. 10, 2006

(65) Prior Publication Data

US 2006/0208751 A1 Sep. 21, 2006

(30) Foreign Application Priority Data

Mar. 15, 2005 (TW) .............................. 94107948 A (51) Int. Cl.
*G01R 31/02* (2006.01)

(52) U.S. Cl. ........................................ 324/761; 324/754

(58) Field of Classification Search ....................... None
See application file for complete search history.

(56) References Cited

U.S. PATENT DOCUMENTS

| 5,388,998 | A | * | 2/1995 | Grange et al. | ................. | 439/66 |
| 5,447,442 | A | * | 9/1995 | Swart | ........................... | 439/77 |
| 6,909,056 | B2 | * | 6/2005 | Vinther | ....................... | 174/260 |

* cited by examiner

*Primary Examiner*—Vinh P Nguyen
(74) *Attorney, Agent, or Firm*—Bacon & Thomas PLLC (57) ABSTRACT

An elastic micro probe includes an electrically conductive and stretchable spring, which has a first end, a second end opposite to the first end, and connection points disposed adjacent to the first end for connection to an external element, an electrically conductive probe body, which has a first end connected to the second end of the spring and a second end vertically upwardly protruding over the first end of the spring, and an electrically conductive tip, which has a bottom side connected to the second end of the probe body such that when the tip is pressed, the probe body is forced to move the second end of the spring, thereby causing the spring to be stretched and elastically deformed.

8 Claims, 12 Drawing Sheets

ELASTIC MICRO PROBE AND METHOD OF MAKING SAME

BACKGROUND OF THE INVENTION

1. Field of the Invention

The present invention relates to micro probes and more particularly, to an elastic micro probe for use as a circuit connection interface. The invention relates also to the fabrication of the elastic micro probe.

2. Description of the Related Art

When testing high-density or high-speed electrical devices (for example, LSI or VLSI circuits), a probe card having a big amount of elastic micro contacts (probes) shall be used. By means of the resilient and electrically conductive material property of the elastic micro probes, the probe card is used as an electric connection medium between the test apparatus and the device to be tested, for example, an LSI chip, VLSI chip, semiconductor wafer, semiconductor chip, semiconductor package, or printed circuit board. Elastic micro contacts can also be used as lead wire means for an IC package. For easy understanding of the present invention, elastic micro contacts are described as probes for probe cards.

Conventionally, elastic micro probes, more particularly upright probes are made by means of forging technology or micro electromechanical technology.

Figure 1:
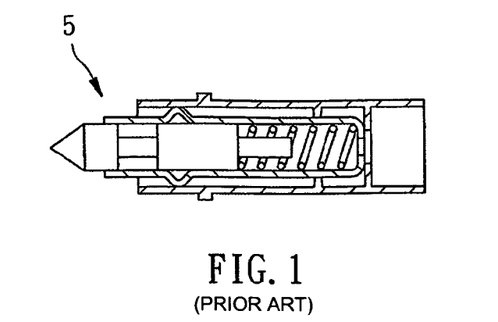
FIG. 1 is a sectional view of an elastic micro probe according to the prior art.

FIG. 1 shows an elastic probe 5 according to the prior art. This structure of elastic probe 5 is comprised of a plurality of parts that are separately made through a precision manufacturing process and then assembled together. Through a precision manufacturing process, the parts can be made subject to the desired precision. However, it is complicated to assemble the precision parts. Because the spring member for this elastic probe is a thin and elongated metal wire member, it has a low stability. When compressed, the spring member may be biased to rub against the peripheral wall, resulting in unnecessary wearing and tip contact instability.

Figure 2A:
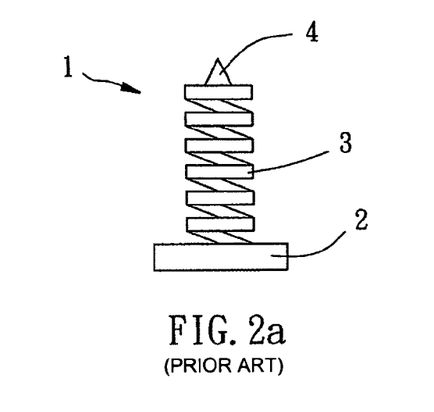
FIG. 2a is a side view of a spring probe according to another prior art.
Figure 2B:
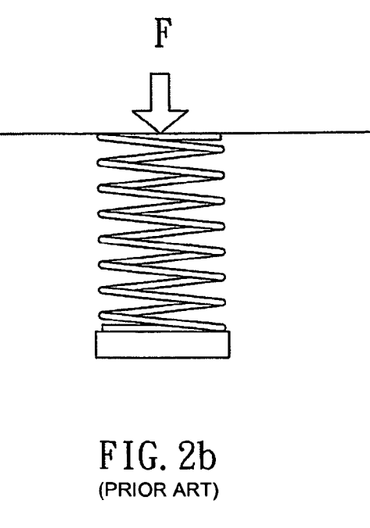
FIG. 2b is a schematic drawing showing a spring probe compressed according to the prior art.
Figure 2C:
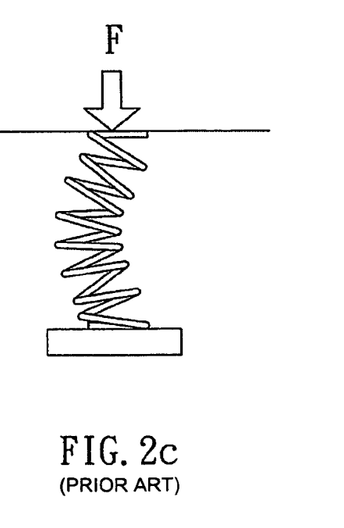
FIG. 2c is a schematic drawing showing a spring probe compressed and buckling according to the prior art.

In order to eliminate the problem of complicated assembly process, there are manufacturers who employ a semiconductor integration manufacturing process to fabricate spring probes directly from a substrate. This semiconductor integration manufacturing process eliminates the assembly process. FIG. 2a shows a spring probe 1 made according to this semiconductor integration manufacturing process. According to this design, the spring body 3 of the spring probe 1 blocks the solder joint 2 (see FIG. 2a). When damaged, the spring probe 1 is not replaceable. By means of the spring body 3 between the top tip 4 and the bottom solder joint 2, the spring probe 1 is compressively deformable upon a pressure. The H (height) to W (width) ratio of a spring probe is normally below 3.7. FIG. 2b shows a spring probe of H/W<3.7 compressed by a downward force F. FIG. 2c shows a spring probe of H/W>3.7 compressed by a downward force F. As shown in FIG. 2c, the spring probe buckles when being compressed. In order to prevent excessive deformation, the H (height) W (width) ratio of a spring probe must be limited to a certain level. When reducing the width of the spring probe, the height of the spring probe must be relatively reduced. In this case, the amount of elastic deformation the spring probe itself can provide is relatively reduced, i.e., the power of the spring probe to compensate flatness error relative to the surface condition of test sample and the limitation of mechanical leveling control is relatively reduced. Following the development of miniaturized semiconductor and package technology, this design of spring probe cannot meet actual requirements. Further, the alignment error of the multilayer structure between the solder joint 2 and the tip 4 cannot assure accurate positioning of the tip during bonding. Further, because the spring probe is completely exposed to the outside, it tends to be damaged.

SUMMARY OF THE INVENTION

The present invention has been accomplished under the circumstances in view. It is the main object of the present invention to provide an elastic micro probe manufacturing process, which is free from the limitation of the H (height) W (width) ratio of the spring, practical for the fabrication of miniaturized elastic micro probes.

It is another object of the present invention to provide an elastic micro probe manufacturing process, which employs micro electromechanical technology to reduce labor-intensive assembly procedure, thereby saving much manufacturing time and improving product precision.

It is still another object of the present invention to provide an elastic micro probe manufacturing process, which is practical for the fabrication of elastic micro probes that have the solder joint disposed at the top side so as to facilitate the maintenance and replacement of probes.

It is still another object of the present invention to provide an elastic micro probe manufacturing process, which is practical for the fabrication of micro spring contacts that have the solder joint and the tip set close to each other for positive positioning to achieve a high precision.

It is still another object of the present invention to provide an elastic micro probe manufacturing process, which employs an embedded architecture, preventing damage of the spring by an external force.

According to the present invention, the elastic micro probe comprises an electrically conductive and stretchable spring, which has a first end, a second end opposite to the first end, and at least one connection point disposed adjacent to the first end for connection to an external circuit; an electrically conductive probe body, which has a first end connected to the second end of the spring and a second end vertically upwardly protruding over the first end of the spring; and an electrically conductive tip, which has a bottom side connected to the second end of the probe body such that when the tip is pressed, the probe body is forced to move the second end of the spring, thereby causing the spring to be stretched and elastically deformed.

The present invention also discloses a method of making the elastic micro probe mentioned above.

DETAILED DESCRIPTION OF THE INVENTION

Figure 3:
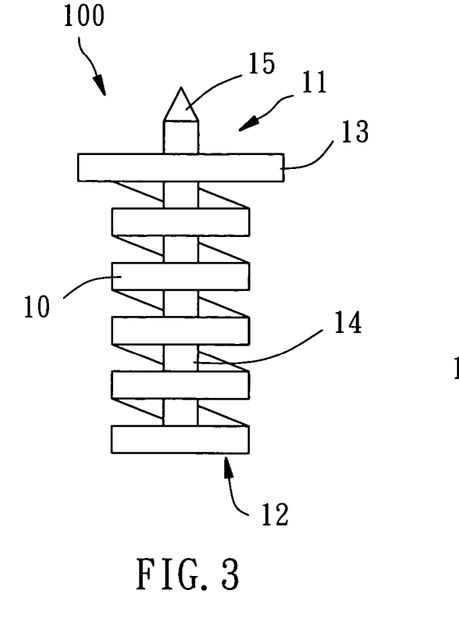
FIG. 3 is a side view of an elastic micro probe according to the present invention.

Referring to FIG. 3, an elastic micro probe 100 in accordance with the first embodiment of the present invention is shown comprising a spring 10, a probe body 14, and a tip 15.

The spring 10 is an electrically conductive, single-screw, compressible, stretchable, hollow member made through micro electromechanical technology, having a first end 11, a second end 12 opposite to the first end 11, and two connection points 13 disposed adjacent to the first end 11 at two sides.

The probe body 14 is an electrically conductive, rod-like member set inside the spring 10, having one end, namely, the bottom end connected to the second end 12 of the spring 10 and the other end, namely, the top end vertically upwardly protruding over the first end 11 of the spring 10.

The tip 15 is an electrically conductive, conical member or pyramid, having the bottom side thereof connected to the free end (top end) of the probe body 14.

Figure 4:
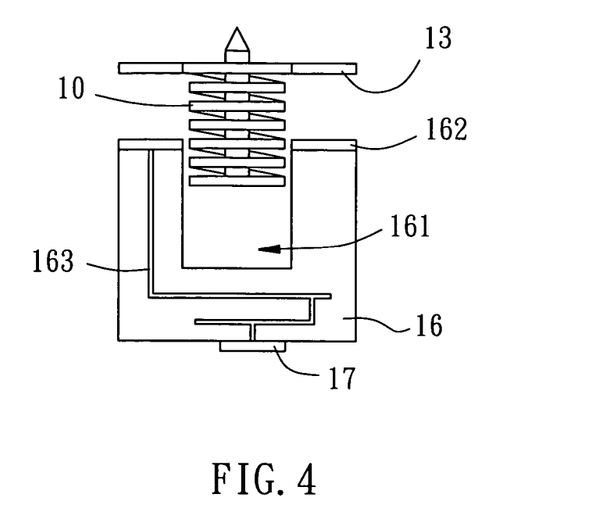
FIG. 4 is a schematic drawing showing insertion of the elastic micro probe of FIG. 3 into a well at a substrate.
Figure 5:
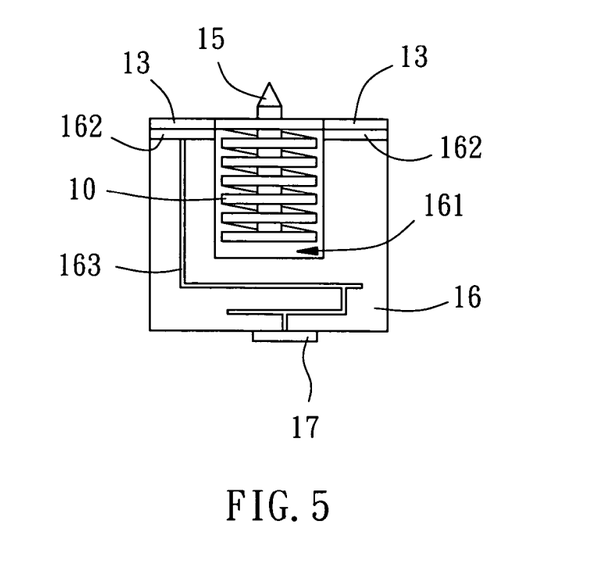
FIG. 5 corresponds to FIG. 4, showing the elastic micro probe bonded to the substrate inside the well.
Figure 6:
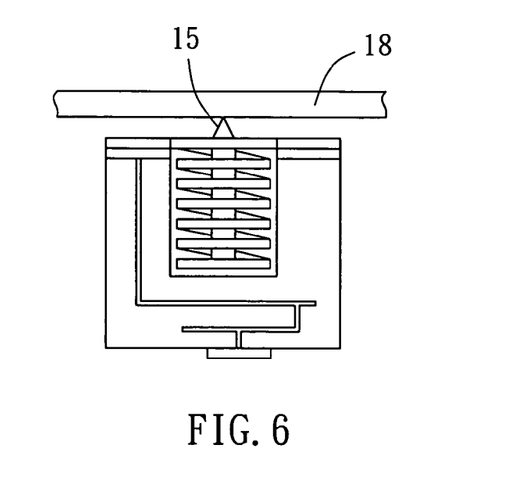
FIG. 6 corresponds to FIG. 5, showing the tip of the elastic micro probe pressed against a test sample.

FIGS. 4-6 show the assembly process of the elastic micro probe 100 and its use to probe a test sample 18. At first, the spring 10 is inserted into a well 161 at a substrate 16 that has a depth greater than the length (height) of the spring 10 after fully extension, and then the connection points 13 of the spring 10 are respectively connected to a respective top solder joint 162 at the substrate 16 (see FIG. 4), for enabling the electric signal detected by the tip 15 to be transmitted through a circuit 163 that is disposed in the substrate 16 and electrically connected to the solder joints 162 to an external test apparatus through an electrical pad 17. When connecting the elastic micro probe 100 to the test sample 18 (see FIG. 6), the top end of the tip 15 is kept in contact with the test sample 18. In order to ensure positive contact between the tip 15 and the test sample 18, the substrate 16 is set closer to the test sample 18. When moving the substrate 16 toward the test sample 18, a pressure is given from the test sample 18 to the tip 15, thereby causing the probe body 14 to move the second end 12 of the spring 10 in the same direction, and the distance between the second end 12 of the spring 10 and the test sample 18 is relatively increased (see FIG. 6). This design ensures positive contact between the tip 15 and the test sample 18. Further, by means of the stretching action of the spring 10, the elastic micro probe 100 is free from the limitation of H (height) to W (width) ratio as encountered in the aforesaid prior art design. In a spring probe made according to the prior art design, the connection point (solder joint) is disposed at the bottom side and the contact point (the point to contact the test sample) is disposed at the top side. If the structure of the elastic micro probe is excessively thin and long, i.e., if the H (height) to W (width) ratio of the elastic micro probe is excessively high, the micro spring contact will buckle when compressed, resulting in instability (please refer to description of the prior art and FIG. 2c). The stretchable design of the spring 10 has the connection points 13 provided at the top side so that the spring 10 is kept straight and will not be curved when stretched. Because the spring 10 is free from the limitation of H (height) to W (width) ratio, the invention meets miniaturized specification requirements, and the spring 10 can be made having a sufficient length to provide the desired amount of elastic deformation.

Figure 7:
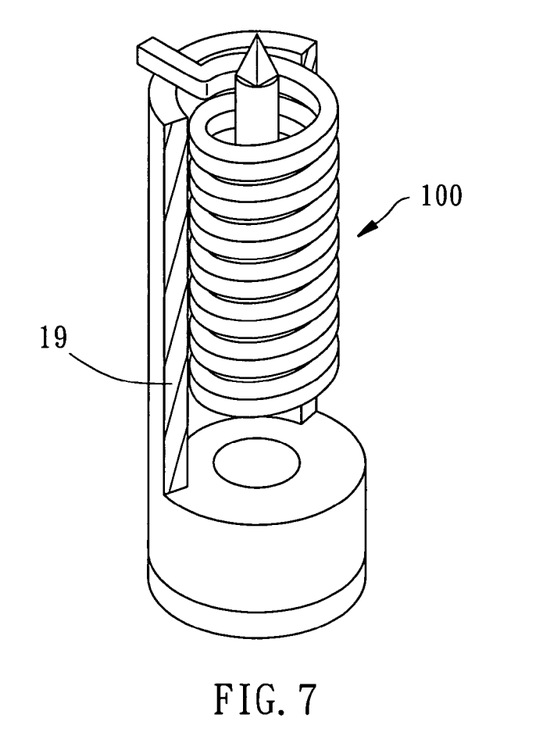
FIG. 7 is a cutaway view showing another installation example of the elastic micro probe shown in FIG. 3.

Further, because the elastic micro probe according to the present invention is made in integrity through micro electromechanical technology, the invention eliminates the labor-intensive probe-by-probe assembly procedure or high-cost automated assembly procedure, thereby accelerating probe card manufacturing speed and greatly improving the precision of the product. Further, because the connection points of the elastic micro probe according to the present invention are disposed at the top side, the solder joint and the tip are kept close to each other, assuring conformity of the solder joint positioning precision and the tip positioning precision. Further, the elastic micro probe adopts an embedded architecture, i.e., the elastic micro probe is embedded in a well at a substrate, the substrate can be made in the form of a raised socket 19 as shown in FIG. 7 or a hollow frame (not shown). Further, the embedded architecture of the present invention has the elastic micro probe be well protected against external objects. If the elastic micro probe is damaged and a replacement is needed, the top-sided solder joint (connection points) can easily be melted for replacing probes. Therefore, the maintenance work of the probe card is easy.

Figure 8A:
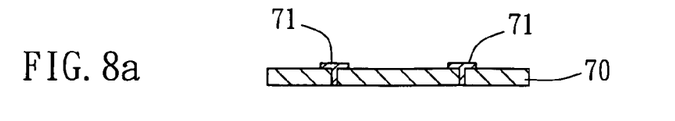
FIGS. 8a-8h show an elastic micro probe manufacturing steps according to a second embodiment of the present invention.
Figure 8B:
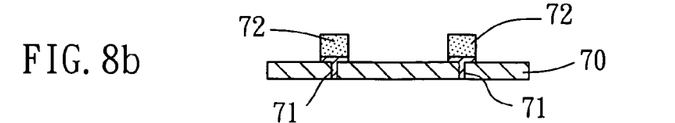
Figure 8C:
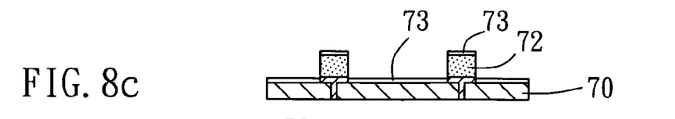
Figures 8D, 8E:
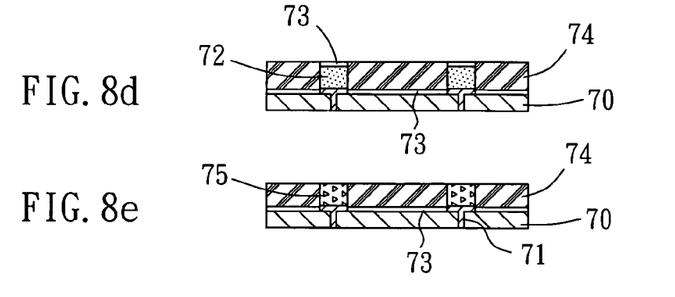
Figure 8F:
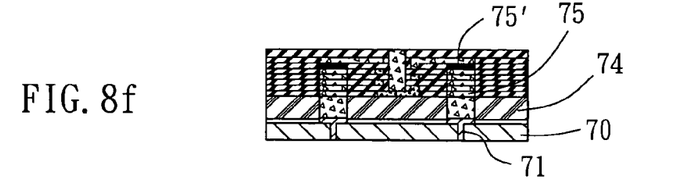
Figure 8G:
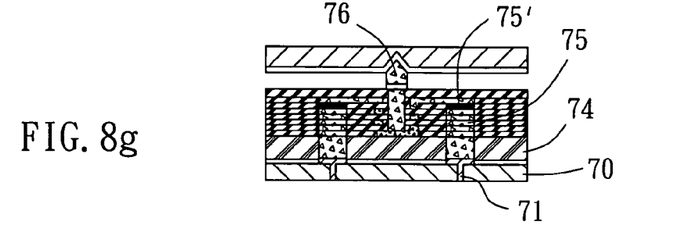
Figure 8H:
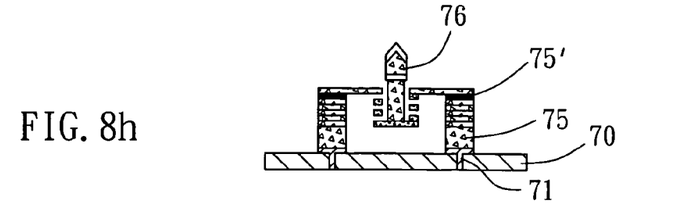
Figure 9A:
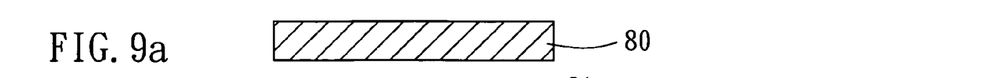
FIGS. 9a-9l show an elastic micro probe manufacturing steps according to a third embodiment of the present invention.
Figure 9B:
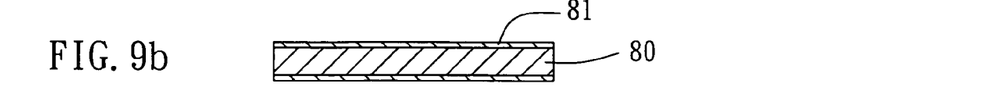
Figure 9C:
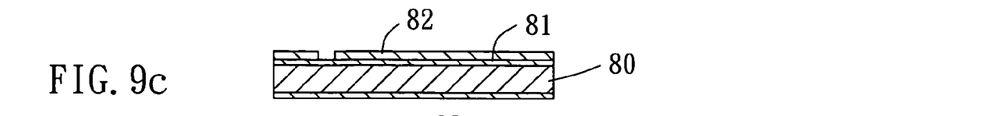
Figure 9D:
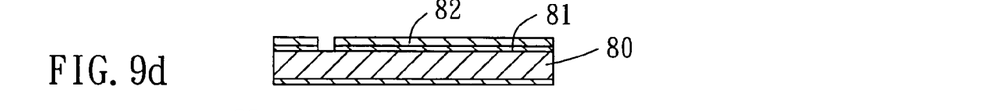

FIGS. 8a-8h show an elastic micro probe manufacturing method according to the second embodiment of the present invention. According to this manufacturing method, a socket and an elastic micro probe are made in integrity, thereby simplifying the manufacturing process. This manufacturing method includes the steps of:

(a) preparing a substrate 70 having a circuit 71 as shown in FIG. 8a;

(b) laying a shielding layer 72 having a patterned opening on the circuit 71 of the substrate 70 as shown in FIG. 8b, which shielding layer 72 can be photoresist and which patterned opening can be achieved by means of a semiconductor photo lithographic technology;

(c) depositing a conductive layer 73 on the top side of the substrate 70 and the shielding layer 72 by evaporation deposition, sputtering deposition, or electroplating as shown in FIG. 8c;

(d) forming a sacrificial layer 74 on the top side of the conductive layer 73 and leveling the sacrificial layer 74 by grinding as shown in FIG. 9d, which sacrificial layer 74 can be formed of one or multiple metal materials, polymers, or metal oxide materials by means of micro electroforming, spray-painting, or chemical vapor deposition technology;

(e) removing the shielding layer 72, and depositing a structural metal layer 75 on the same place of the position of the shielding layer 72, then leveling the sacrificial layer 74 and the structural metal layer 75 by grinding as shown in FIG. 8e, which structural metal layer 75 can be formed of one or multiple highly conductive metal materials by means of micro electroforming, evaporation deposition or sputtering deposition technology;

(f) repeating steps (b)-(e) to form the desired spring, probe body, and socket structure in which a connection metal 75' is provided as shown in FIG. 8f by laminating the structural metal layer 75 one above another; wherein the connection metal 75' can be formed of solder materials such as tin, tin lead alloy, gold, silver, bismuth for easy melting during a replacement work;

(g) bonding the spring, probe body and socket structure thus obtained with a tip 76 which is made through a precision mechanical processing procedure and temporarily secured to another substrate as shown in FIG. 8g; and (h) removing the sacrificial layer 74, the conducting layer 73 and the adhesive means that secures the tip 76 to the other substrate so as to obtain the desired socket-based elastic micro probe as shown in FIG. 8h.

Figure 9E:
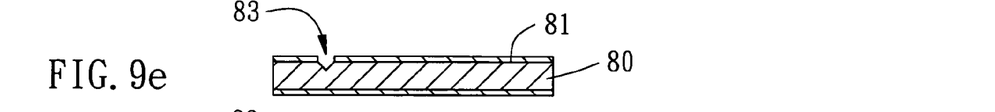
Figure 9F:
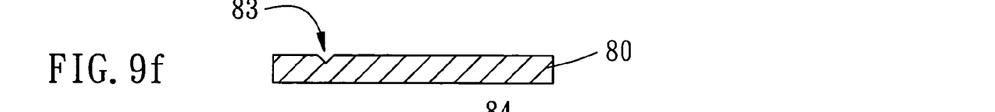
Figure 9G:
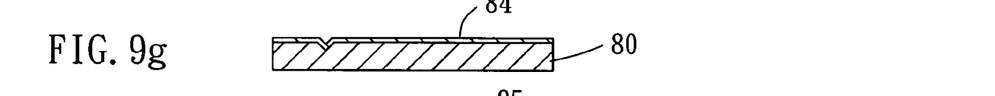
Figure 9H:
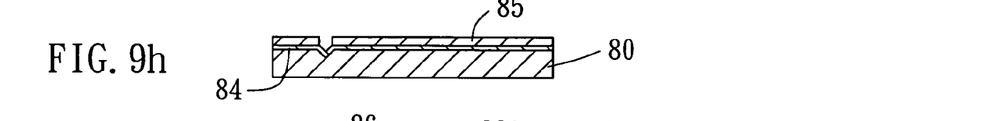
Figure 9I:
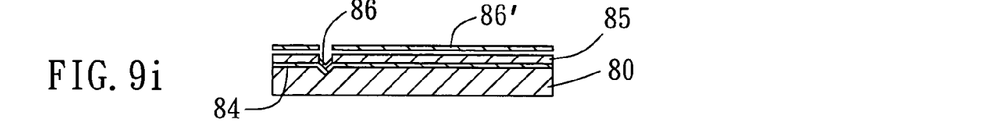
Figure 9J:
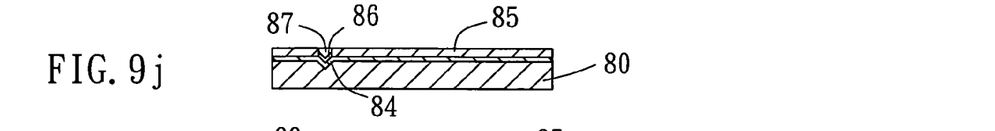
Figure 9K:
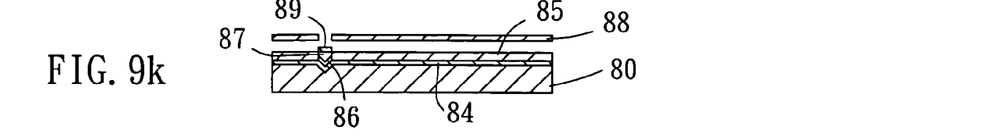
Figure 9L:
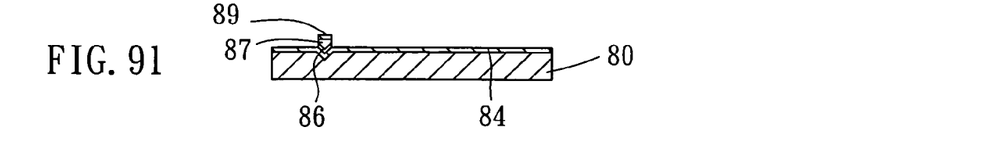

FIGS. 9a-9l show an elastic micro probe manufacturing method according to the third embodiment of the present invention. This embodiment is substantially similar to the aforesaid second embodiment of the present invention with the exception of the fabrication of the tip 76. According to this embodiment, the procedure of making the tip 76 comprises the steps of:

(a) preparing a monocrystalline silicon substrate 80 (or a substrate having an electrically insulative surface) as shown in FIG. 9a;

(b) laying a first shielding layer 81 on the top surface of the substrate 80 by LPCVD (low pressure chemical vapor deposition) as shown in FIG. 9b, which first shielding layer 81 can be formed of silicon nitride, silicon oxide, silicon dioxide, polymers, or a photoresist;

(c) laying a second shielding layer 82 having an opening on the top surface of the first shielding layer 81 as shown in FIG. 9c;

(d) removing the exposed part of the first shielding layer 81 away from the opening of the second shielding layer 82 by RIE (reactive ion etching) as shown in FIG. 9d;

(e) removing the second shielding layer 82, and then etching the substrate 80 with an anisotropic etching liquid (for example, potassium hydroxide), so as to form a notch 83 corresponding to the opening of the second shielding layer 81 as shown in FIG. 9e;

(f) removing the first shielding layer 81 as shown in FIG. 9f;

(g) depositing a conductive layer 84 on the top surface of the substrate 80 as shown in FIG. 9g, which conductive layer 84 can be formed of titanium, titanium-based metal material, or any of a variety of metal materials that have a high conductivity and adhesion power;

(h) laying a shielding layer 85 on the top surface of the conductive layer 83, which shielding layer has an opening disposed right above the notch 83 as shown in FIG. 9h;

(i) depositing an enhanced film 86 on the surface of the conductive layer 84 above the notch 83 subject to the use of a mask 86' as shown in FIG. 9i;

(j) electroforming a structural metal layer 87 above the notch 83 and then leveling the structural metal layer 87 by grinding as shown in FIG. 9j;

(k) plating a bonding layer 89 on the top surface of the structural metal layer 87 subject to the use of a mask 88 as shown in FIG. 9k; and (l) removing the shielding layer 85 so as to obtain a tip at the substrate as shown in FIG. 9l.

Figure 10A:
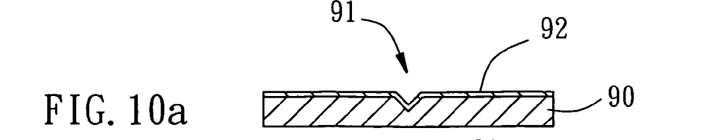
FIGS. 10a-10j show an elastic micro probe manufacturing steps according to a fourth embodiment of the present invention.
Figure 10B:
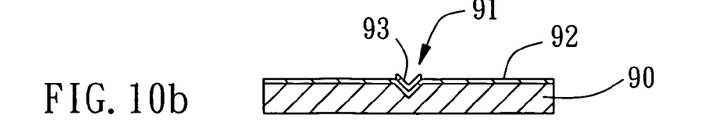
Figure 10C:
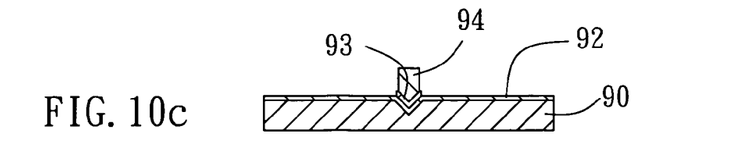
Figure 10D:
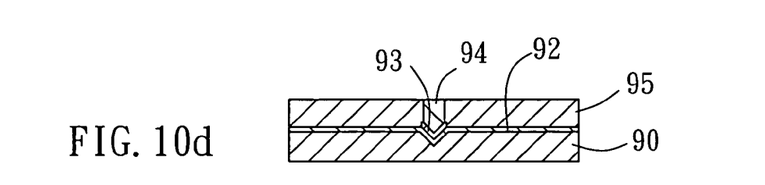
Figure 10E:
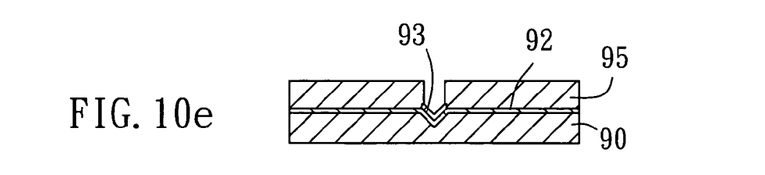
Figure 10F:
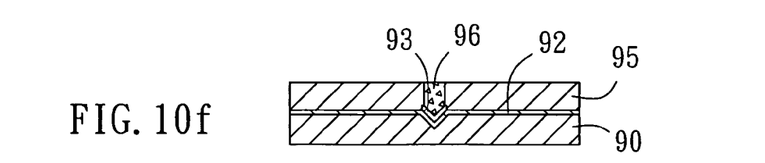
Figure 10G:
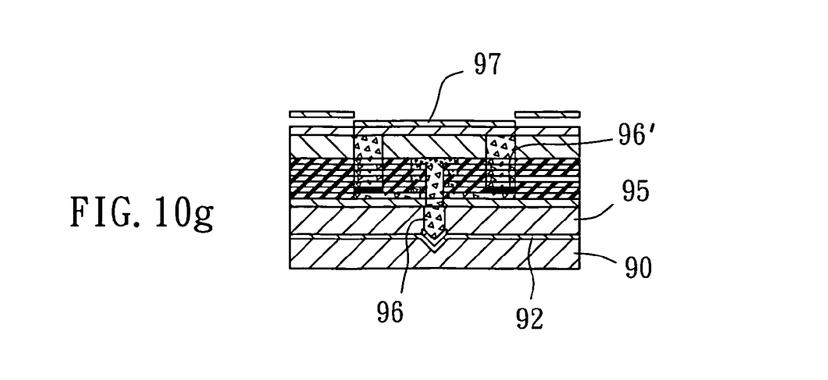
Figure 10H:
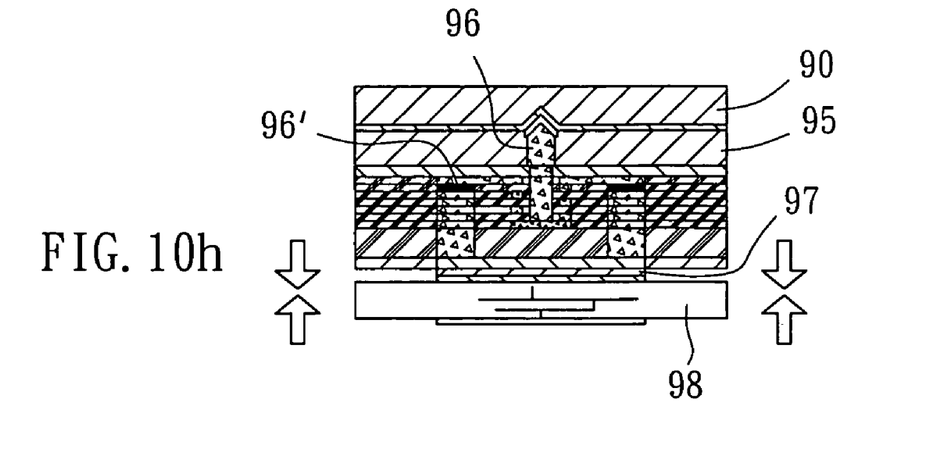
Figure 10I:
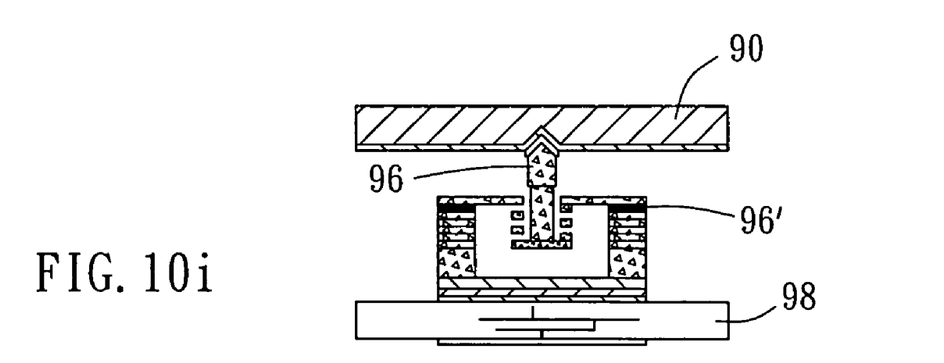
Figure 10J:
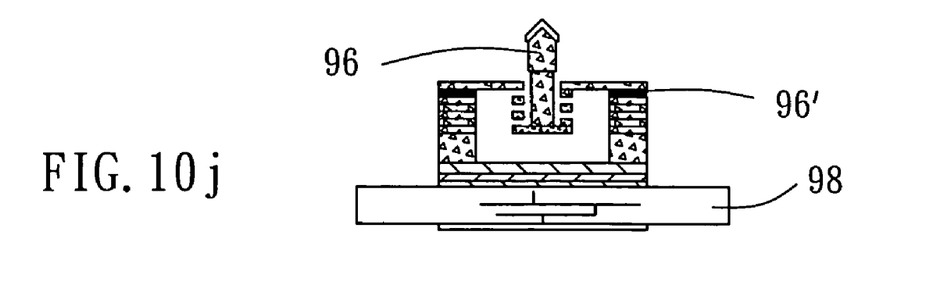

FIGS. 10a-10j show an elastic micro probe manufacturing method according to the fourth embodiment of the present invention. The above-mentioned embodiment is to make an elastic micro probe directly on a substrate by lamination. Alternatively, the socket and the probe body can be produced at the same time and then fastened to the substrate. The manufacturing method according to this embodiment comprises the steps of:

(A) preparing a substrate 90 having a conical notch 91 at the top side thereof (the conical notch of the substrate can be made by a precision machine processing process, chemical etching, or hot press molding) and then depositing a conductive material 92 on the top surface of the substrate 90 as shown in FIG. 10a (the conductive material can be deposited on the substrate by evaporation deposition, sputtering deposition, or electroplating);

(B) depositing an enhanced film 93 on the surface of the notch 91 subject to the use of a mask (similar to FIG. 9k) by means of sputtering deposition or evaporation deposition as shown in FIG. 10b;

(C) laying a patterned shielding layer 94 over the notch 91 as shown in FIG. 10c;

(D) depositing a sacrificial layer 95 on the top surface of the substrate 90 by electroplating, sputtering deposition, or evaporation deposition as shown in FIG. 10d;

(E) removing the shielding layer 94 as shown in FIG. 10e;

(F) electroforming a structural metal layer 96 on the top side of the notch 91 and then leveling the sacrificial layer 95 and the structural metal layer 96 by grinding as shown in FIG. 9f;

(G) repeating steps (C) to (F) to laminate the desired structure (for example, connection metal 96'), and then depositing a bonding layer 97 subject to the use of a mask as shown in FIG. 10g, which bonding layer 97 can be formed of solder metal such as gold, tin, tin lead alloy, tin silver alloy, tin bismuth alloy, or the like by means of electroplating, sputtering deposition or evaporation deposition, and the mask used can be a flat plate having a patterned through hole;

(H) bonding the bonding layer 97 to an electronic substrate 98 as shown in FIG. 10h;

(I) removing the sacrificial layer 95 as shown in FIG. 9i; and (J) etching the conductive material 92 so as to strip off the substrate 90 as shown in FIG 10j.

Further, the connection metal 96' shown in FIGS. 10g-10j can be a solder material such as tin, tin lead alloy, gold, silver, or bismuth for easy melting during a replacement work.

Figure 11A:
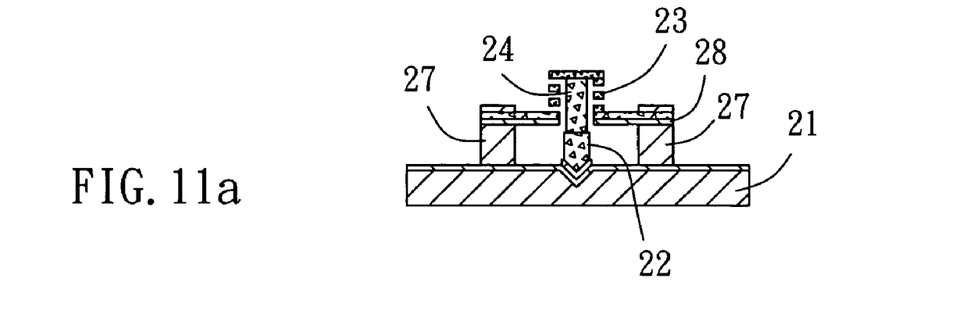
FIG. 11a-11c show elastic micro probe manufacturing steps according to a fifth embodiment of the present invention.
Figure 11B:
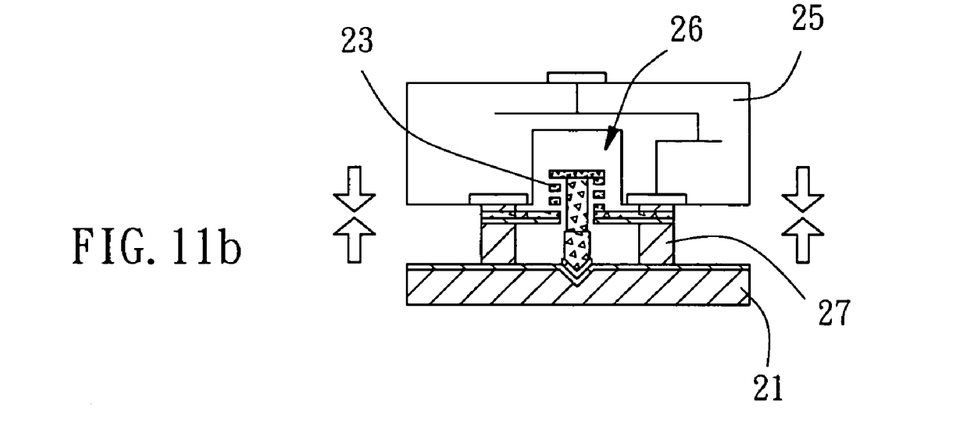
Figure 11C:
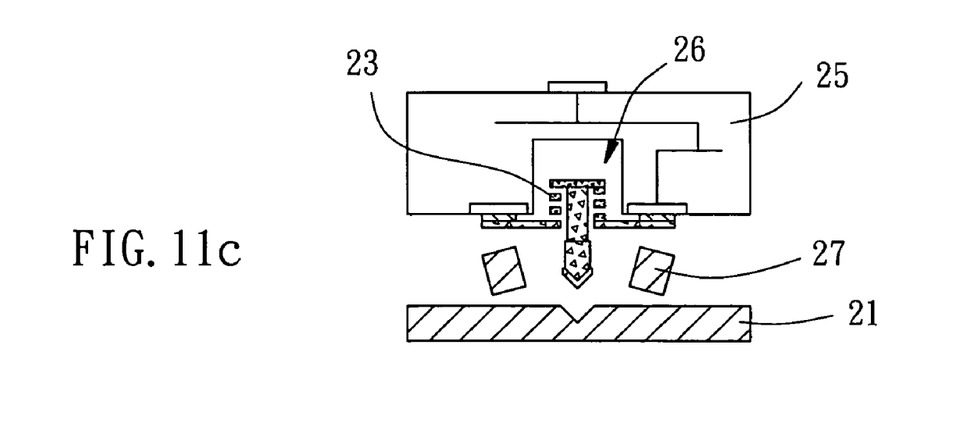

FIGS. 11a-11c show an elastic micro probe manufacturing method according to the fifth embodiment of the present invention. This embodiment is to have the elastic micro probe be directly embedded into the substrate or socket. The manufacturing method according to this embodiment comprises the steps of (a) preparing an elastic micro probe, which comprises a substrate 21, a spring 23, a tip 22, a probe body 2, a connecting block 27 connected between the spring 23 and the substrate 21, and a seed layer (or sacrificial layer) 28 connected between the connecting block 27 and the spring 23 (see FIG. 11*a*), (b) bonding a substrate 25 (or socket) to the spring 23 to have the spring 23 be inserted into a well 26 at the substrate 25 (see FIG. 11*b*), and (c) removing the seed layer 28 so as to strip off the connecting block 27 and the substrate 21 (see FIG. 11*c*). Thus, the elastic micro probe and the electronic substrate are bonded together.

Further, tenon and mortise joint means may be provided between the elastic micro probe and the electronic substrate (or socket) to reinforce the positioning.

In the aforesaid various embodiments of the present invention, the spring of the elastic micro probe is a singe-screw spring. Alternatively, the spring can be made having a rectangular or triangular cross section, or any of a variety of other geometric profiles.

Figure 12:
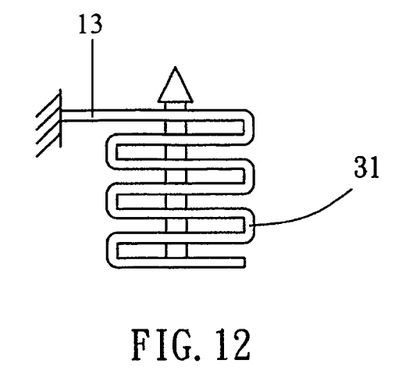
FIG. 12 illustrates the structure of an elastic micro probe according to a sixth embodiment of the present invention.

FIG. 12 shows an elastic micro probe constructed according to the sixth embodiment of the present invention. According to this embodiment, the spring 31 does not have a helical structure. Bending a metal spring strip into or directly shaping a detoured structure that is stretchable makes the spring 31.

Figure 13:
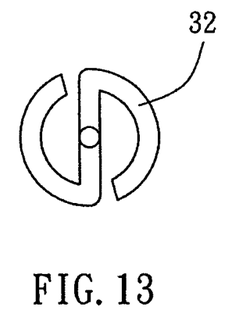
FIG. 13 shows an alternate form of the spring for elastic micro probe according to the present invention.
Figure 14:
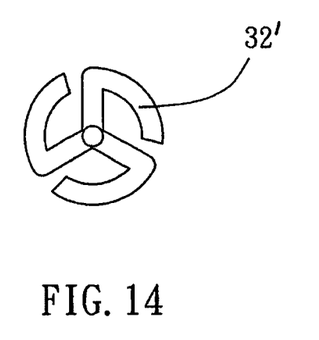
FIG. 14 shows another alternate form of the spring for elastic micro probe according to the present invention.
Figure 15:
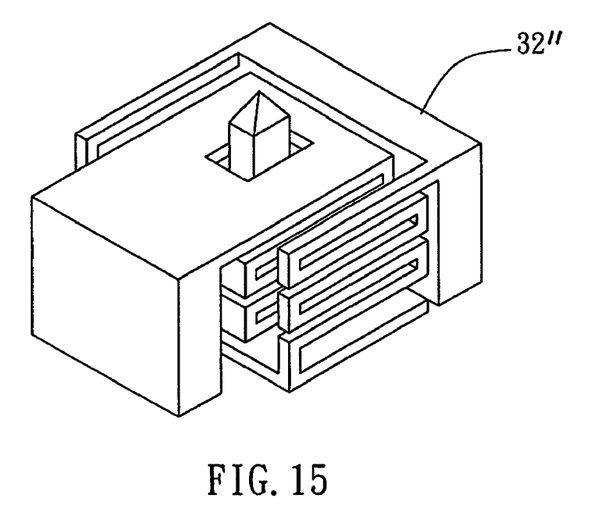
FIG. 15 shows still another alternate form of the spring for elastic micro probe according to the present invention.

In order to prevent biasing of the tip of the elastic micro probe upon contact with the test sample, the spring of the elastic micro probe can be made in any of a variety of other symmetric forms. For example, the spring 32 shown in FIG. 13 has double-helix structure; the spring 32' shown in FIG. 14 has a triple-helix structure; the spring 32" shown in FIG. 15 has two detoured structures. These springs 32, 32', 32" distribute the pressure evenly in different directions when stretched, preventing biasing of the tip.

Figure 16:
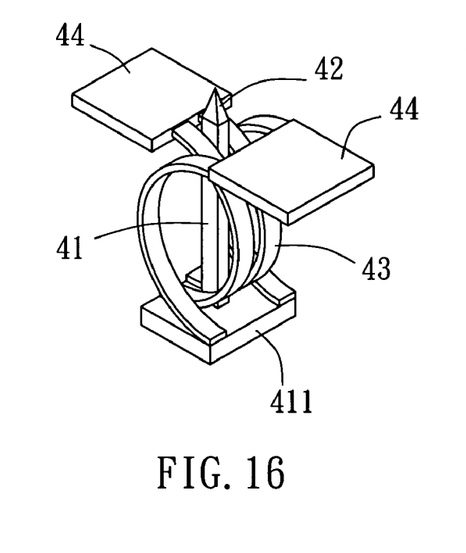
FIG. 16 shows an elastic micro probe made according to the seventh embodiment of the present invention.

FIG. 16 shows an elastic micro probe made according to the seventh embodiment of the present invention. According to this embodiment, the elastic micro probe comprises a probe body 41, a tip 42, four spring members 43, and two bonding pads 44. The probe body 41 has one end terminating in a connecting portion 411. The tip 42 is connected to the other end of the probe body 41. The bonding pads 44 are symmetrically disposed at two sides relative to the probe body 41 and equally spaced from the connecting portion 411 at a distance. The spring members 43 are arched alike members arranged in pairs and curved in two reversed directions, each having a first end connected to the connecting portion 411 and a second end connected to one bonding pad 44.

The aforesaid elastic micro probe can be made by lamination by means of micro electromechanical technology.

Figure 17:
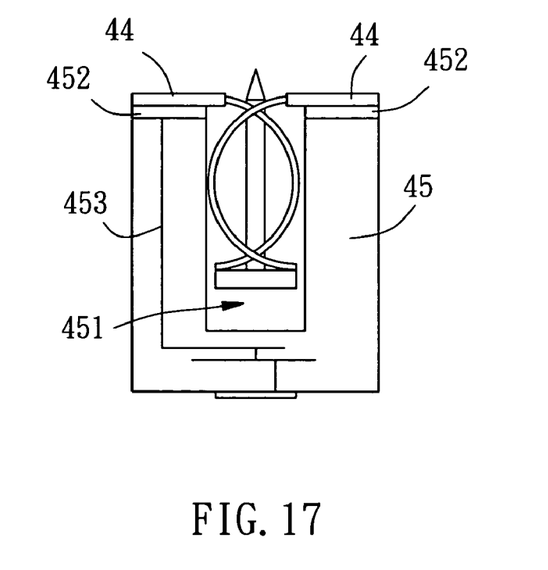
FIG. 17 shows the elastic micro probe of FIG. 16 installed in a substrate.
Figure 18:
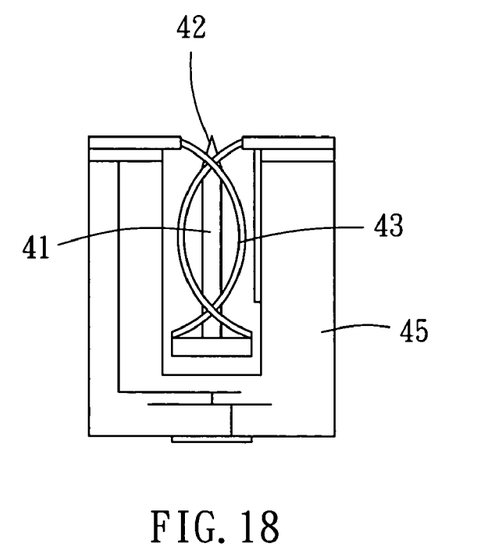
FIG. 18 corresponds to FIG. 17, showing the tip forced downwards and the spring members stretched.

FIGS. 17 and 18 show an elastic micro probe bonded to a substrate 45 according to the present invention. During installation, the probe body 41 and the spring members 43 are inserted into a well 451 at the substrate 45, and then the bonding pads 44 are respectively bonded to a solder joint 452 at the substrate 45 outside the well 451. The substrate 45 has a circuit 453 laid therein to connect the solder joints 452.

When the tip 42 received a pressure during probing, the probe body 41 is forced to stretch the spring members 43 (see FIG. 18). Therefore, this embodiment achieves the objects of the present invention.

Figure 19:
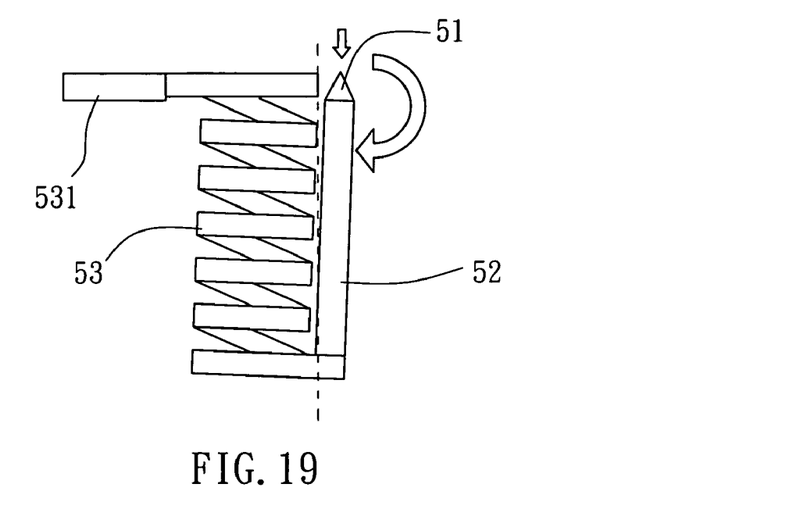
FIG. 19 is a schematic drawing showing the status of an elastic micro probe upon a pressure according to an eighth embodiment of the present invention.

FIG. 19 shows an elastic micro probe made according to the eighth embodiment of the present invention. This embodiment allows the tip 51 to bias laterally subject to a different test sample. At illustrated, the probe body 52 is disposed at an outer side relative to the spring 53 and opposite to the connection point 531 of the spring 53. When the tip 51 received a pressure during probing, the probe body 52 and the connecting point 531 that are respectively connected to the two distal ends of the spring 53 are forced to stretch the spring 53, allowing the tip 51 to bias laterally so as to scrub away the metal-oxide over the test sample and make better conductivity.

Figure 20:
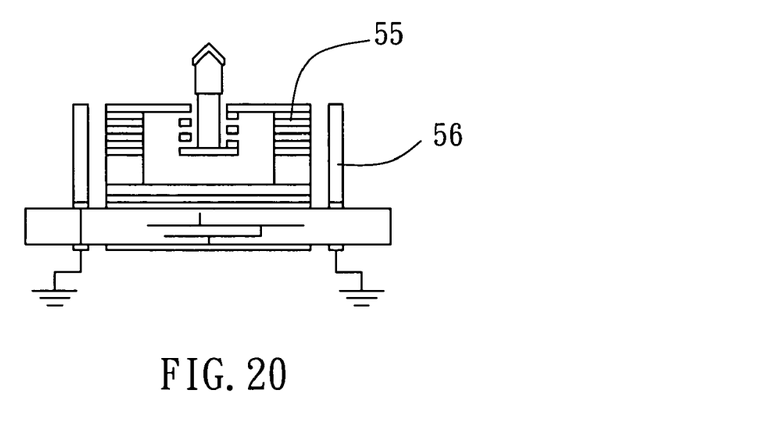
FIG. 20 is a schematic drawing showing an elastic micro probe installed in a socket and a shielding layer added to the outside of the socket according to the present invention.
Figure 21:
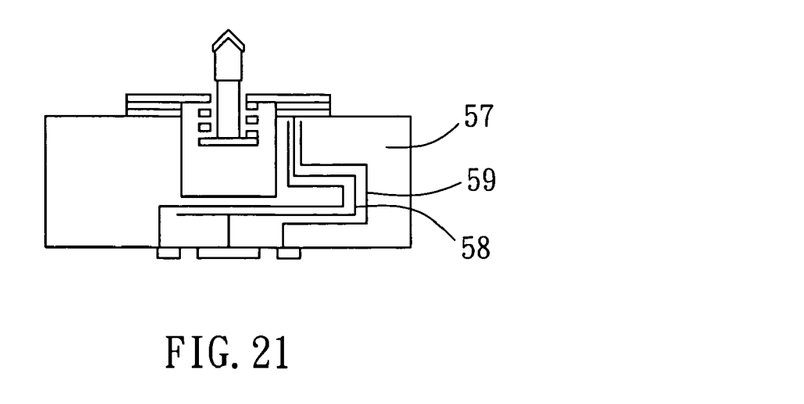
FIG. 21 is a schematic drawing showing an elastic micro probe embedded in a substrate, a grounding line arranged at an outer side relative to the signal line in the substrate according to the present invention.

In order to prevent signal coupling among densely installed elastic micro probes, a shielding layer 56 (of dielectric material) is added to the outside of the socket 55 to provide an optimum signal shielding effect and also to increase the transmission bandwidth. If the elastic micro probe is embedded in a substrate 57 as shown in FIG. 21, a grounding line 59 (grounding conductive material) may be arranged at an outer side relative to the signal line 58 in the substrate to increase the transmission bandwidth and to improve signal quality.

Figure 22:
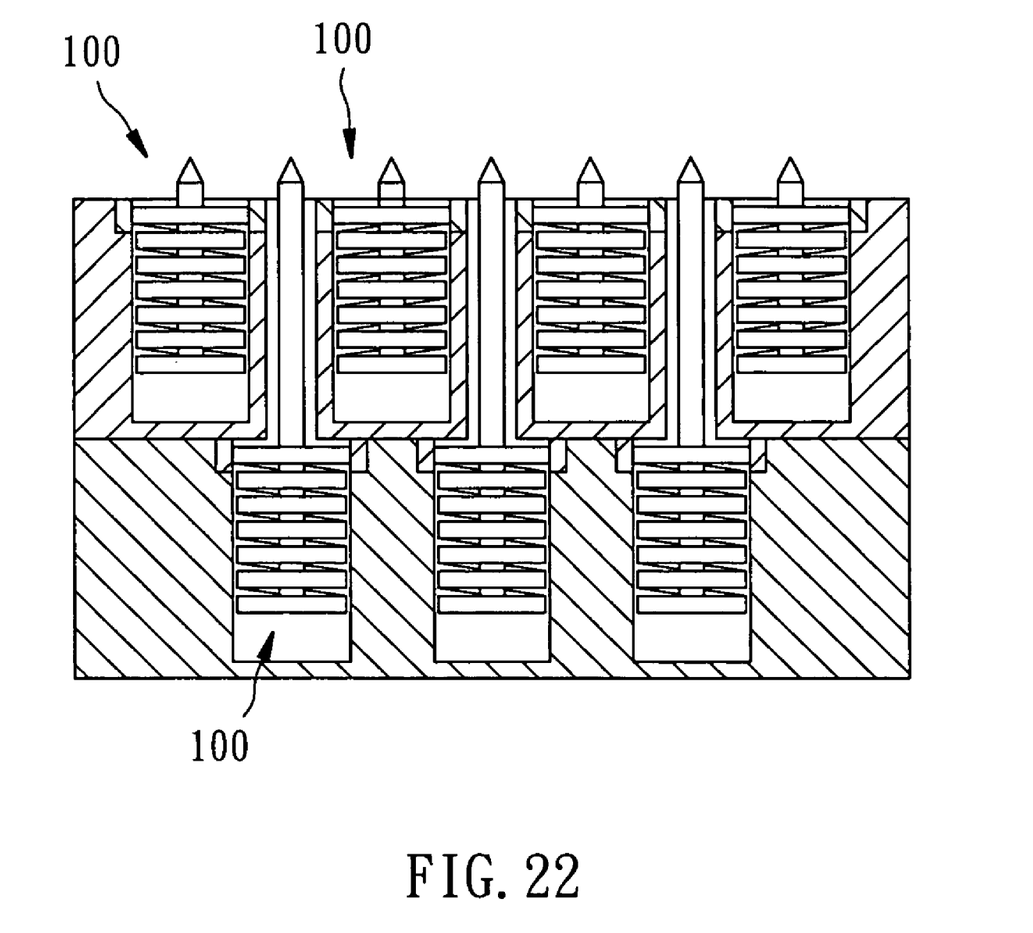
FIG. 22 is a schematic drawing showing multiple elastic micro probes assembled in a multilayer form according to the present invention.

FIG. 22 is a schematic drawing showing multiple elastic micro probes 100 assembled in a multilayer form. According to this arrangement, each elastic micro probe at the lower side has a relatively longer probe body so that the pitch among the tips of the elastic micro probes 100 can be reduced effectivelly.

What is claimed is:

1. An elastic micro probe comprising:
   a spring, which is electrically conductive and stretchable, having a first end, a second end opposite to said first end, and at least one connection point disposed adjacent to said first end for connection to an external element;
   a probe body, which is electrically conductive, having a first end connected to the second end of said spring and a second end vertically upwardly protruding over the first end of said spring;
   when said second end of said probe body is pressed, said probe body is forced to move the second end of said spring, thereby causing said spring to be stretched and elastically deformed.

2. The elastic micro probe as claimed in claim 1, wherein the second end of said probe body further mounts a tip member.

3. The elastic micro probe as claimed in claim 1, wherein the second end of said probe body is shaped into a tip.

4. The elastic micro probe as claimed in claim 1, wherein said spring is comprised of at least one single-screw spring member.

5. The elastic micro probe as claimed in claim 1, wherein said spring and said probe body and said tip are made in integrity by means of micro electromechanical technology.

6. The elastic micro probe as claimed in claim 1, wherein said spring is comprised of at least one spring strip.

7. The elastic micro probe as claimed in claim 1, wherein said spring surrounds said probe body.

8. The elastic micro probe as claimed in claim 1, which is mounted to a substrate and sink into a well in a the substrate.

\* \* \* \* \*